US012686299B2

(12) United States Patent
Nagaluru et al.

(10) Patent No.: US 12,686,299 B2
(45) Date of Patent: Jul. 21, 2026

(54) BATTERY SYSTEM

(71) Applicant: LG Energy Solution, Ltd., Seoul (KR)

(72) Inventors: Sagar Nagaluru, Rochester Hills, MI (US); Nitin Bharane, Rochester Hills, MI (US); Sandeep Vankineni, Northville, MI (US); Bhavya Jampani, Warren, MI (US)

(73) Assignee: LG Energy Solution, Ltd., Seoul (KR)

( * ) Notice: Subject to any disclaimer, the term of this patent is extended or adjusted under 35 U.S.C. 154(b) by 104 days.

(21) Appl. No.: 18/625,527

(22) Filed: Apr. 3, 2024

(65) Prior Publication Data

US 2025/0313125 A1 Oct. 9, 2025

(51) Int. Cl.

| | |
|---|---|
| ***B60L 58/18*** | (2019.01) |
| ***B60L 3/00*** | (2019.01) |
| ***H01M 10/42*** | (2006.01) |
| ***H03K 17/60*** | (2006.01) |
| ***H03K 17/687*** | (2006.01) |

(52) U.S. Cl.

CPC ............. *B60L 58/18* (2019.02); *B60L 3/0084* (2013.01); *H01M 10/425* (2013.01); *H03K 17/60* (2013.01); *H03K 17/687* (2013.01); *B60L 2240/547* (2013.01); *H01M 2010/4278* (2013.01)

(58) Field of Classification Search

CPC . B60L 58/18; B60L 2240/547; B60O 3/0084; H01M 10/425; H01M 2010/4278; H03K 17/60; H03K 17/687

USPC ............................................................ 701/22

See application file for complete search history.

(56) References Cited

U.S. PATENT DOCUMENTS

2013/0271072 A1* 10/2013 Lee ....................... H02J 7/0069 320/108
2015/0160641 A1 6/2015 Jung
(Continued)

FOREIGN PATENT DOCUMENTS

| | | | |
|---|---|---|---|
| CN | 117239937 A * | 12/2023 | |
| JP | 2023137721 A | 9/2023 | |
| KR | 101735733 B1 * | 5/2017 | ......... G01R 31/3624 |

OTHER PUBLICATIONS

CN-117239937-A English Translation (Year: 2023).*
KR101735733B1 English Translated (Year: 2017).*

*Primary Examiner* — Kenneth M Dunne
*Assistant Examiner* — Brian K Palmarchuk
(74) *Attorney, Agent, or Firm* — Bookoff McAndrews, PLLC

(57) ABSTRACT

A battery system includes a battery subpack having first and second battery cells, a cell monitoring circuit, and a subpack microprocessor. The cell monitoring circuit obtains first and second voltage values. A first switch circuit applies an operational voltage to the subpack microprocessor in response to a first control signal from a master controller. The master controller sends a first message that requests the first and second voltage values from the subpack microprocessor. The master controller stops generating the first control signal to induce the first switch circuit to remove the operational voltage from the subpack microprocessor when the master controller does not receive a second message having the first and second voltage values from the subpack microprocessor within a predetermined amount of time after sending the first message.

18 Claims, 12 Drawing Sheets

(56) References Cited

U.S. PATENT DOCUMENTS

| | | | | |
|---|---|---|---|---|
| 2015/0188334 | A1* | 7/2015 | Dao | H02J 7/0013 702/63 |
| 2015/0340888 | A1* | 11/2015 | Hofer | G01N 7/00 374/143 |
| 2019/0143834 | A1* | 5/2019 | Godo | B60L 58/21 702/63 |
| 2019/0377313 | A1* | 12/2019 | Song | G05B 19/0428 |
| 2020/0036194 | A1 | 1/2020 | Park et al. | |
| 2020/0106278 | A1 | 4/2020 | Sung et al. | |
| 2020/0373764 | A1 | 11/2020 | Lee et al. | |
| 2021/0213851 | A1* | 7/2021 | Cooper | B60L 53/66 |
| 2021/0328445 | A1 | 10/2021 | Hofer et al. | |
| 2023/0275276 | A1 | 8/2023 | Choi et al. | |

* cited by examiner

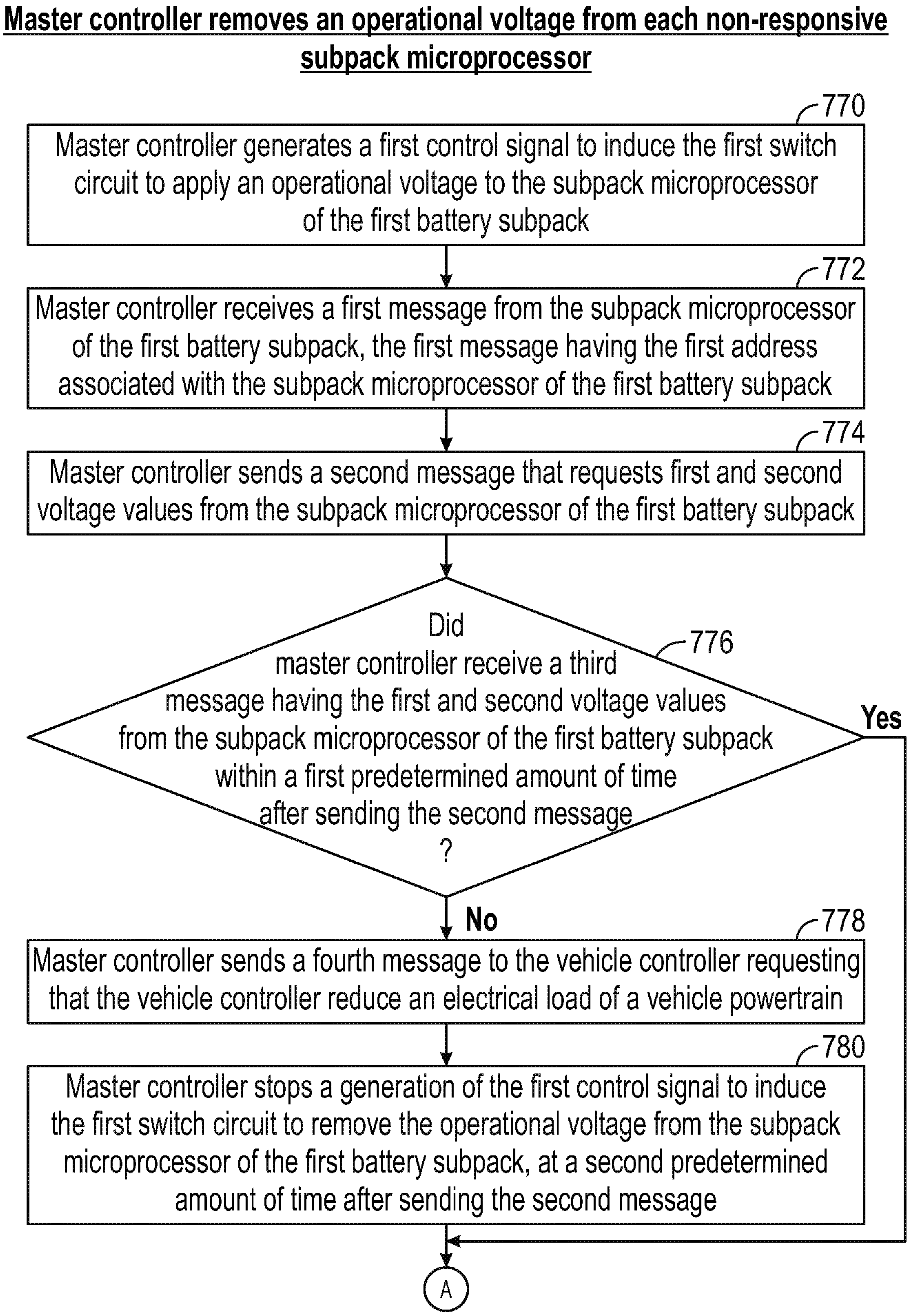

FIG. 7

Master controller removes an operational voltage from each non-responsive subpack microprocessor

770

Master controller generates a first control signal to induce the first switch circuit to apply an operational voltage to the subpack microprocessor of the first battery subpack

772

Master controller receives a first message from the subpack microprocessor of the first battery subpack, the first message having the first address associated with the subpack microprocessor of the first battery subpack

774

Master controller sends a second message that requests first and second voltage values from the subpack microprocessor of the first battery subpack

776

Did master controller receive a third message having the first and second voltage values from the subpack microprocessor of the first battery subpack within a first predetermined amount of time after sending the second message ?

Yes

No

778

Master controller sends a fourth message to the vehicle controller requesting that the vehicle controller reduce an electrical load of a vehicle powertrain

780

Master controller stops a generation of the first control signal to induce the first switch circuit to remove the operational voltage from the subpack microprocessor of the first battery subpack, at a second predetermined amount of time after sending the second message

A

Each subpack microprocessor determines its address & opens subpack contactors when it doesn't receive acknowledgement from a master controller

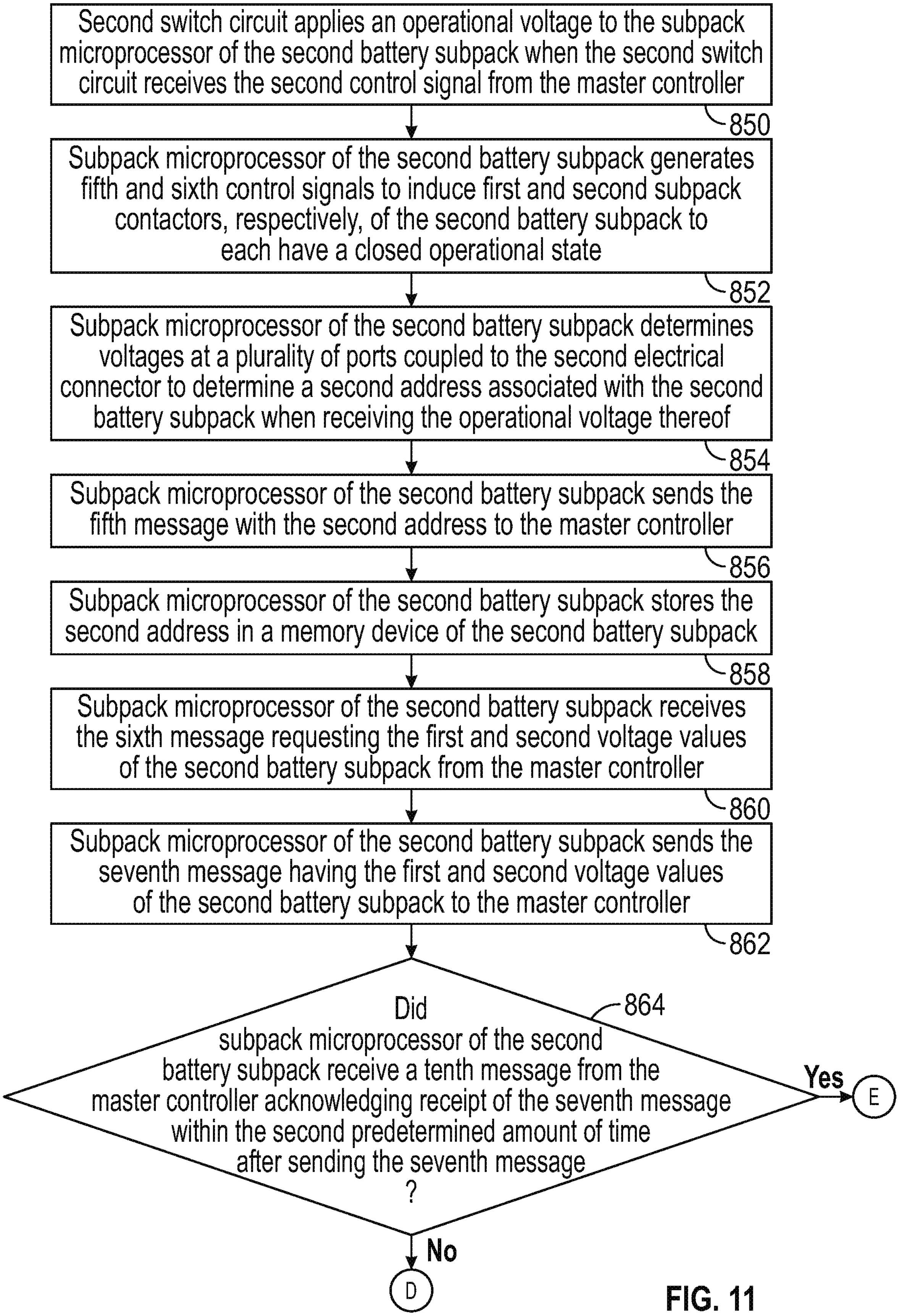

FIG. 11

Second switch circuit applies an operational voltage to the subpack microprocessor of the second battery subpack when the second switch circuit receives the second control signal from the master controller
�ণ850

Subpack microprocessor of the second battery subpack generates fifth and sixth control signals to induce first and second subpack contactors, respectively, of the second battery subpack to each have a closed operational state
�ণ852

Subpack microprocessor of the second battery subpack determines voltages at a plurality of ports coupled to the second electrical connector to determine a second address associated with the second battery subpack when receiving the operational voltage thereof
�ণ854

Subpack microprocessor of the second battery subpack sends the fifth message with the second address to the master controller
�ণ856

Subpack microprocessor of the second battery subpack stores the second address in a memory device of the second battery subpack
�ণ858

Subpack microprocessor of the second battery subpack receives the sixth message requesting the first and second voltage values of the second battery subpack from the master controller
�ণ860

Subpack microprocessor of the second battery subpack sends the seventh message having the first and second voltage values of the second battery subpack to the master controller
�ণ862

Did subpack microprocessor of the second battery subpack receive a tenth message from the master controller acknowledging receipt of the seventh message within the second predetermined amount of time after sending the seventh message ?
⎯864

Yes  E

No
D

BATTERY SYSTEM

BACKGROUND

A vehicle battery pack typically has a plurality of battery subpacks electrically coupled in parallel to one another. Each battery subpack has a monitoring circuit that monitors the parameters of batteries in the battery subpack and a plurality of cables attached between the monitoring circuit and the subpack microprocessor.

The vehicle battery pack typically has a master controller that receives messages from subpack microprocessors in the battery subpacks. The master controller can electrically decouple battery subpacks from a vehicle powertrain utilizing battery pack contactors. However, the battery subpacks do not have battery subpack contactors to decouple individual battery subpacks from a remaining portion of the battery subpacks. Further, the master controller cannot remove an operational voltage from a subpack microprocessor in a battery subpack when a communication fault occurs between the subpack microprocessor and the master controller—which would open the battery subpack contactors.

Further, the master controller cannot apply an operational voltage to the subpack microprocessor to have the subpack microprocessor send the address to the master controller, wherein the address is based on voltages applied to an electrical connector.

The inventors herein have recognized a need for an improved battery system that utilizes a switch circuit operably coupled between a master controller and a battery subpack that allows the master controller to apply an operational voltage to the subpack microprocessor in the battery subpack to obtain the address of the battery subpack. Further, the improved battery system allows the master controller to utilize the switch circuit to remove the operational voltage from the subpack microprocessor in the battery subpack when a communication fault occurs between the master controller and the subpack microprocessor which opens the battery subpack contactors in the respective battery subpack to electrically decouple the battery subpack from the other battery subpacks.

SUMMARY

A battery system according to aspects of the disclosure is provided. The battery system includes a first battery subpack having a subpack microprocessor operably coupled to a first electrical connector. The battery system further includes a first switch circuit that is electrically coupled to the first battery subpack. The first switch circuit applies an operational voltage to the subpack microprocessor of the first battery subpack when the first switch circuit receives a first control signal from a master controller. The subpack microprocessor of the first battery subpack determines voltages at a plurality of ports coupled to the first electrical connector to determine a first address associated with the first battery subpack when receiving the operational voltage. The subpack microprocessor of the first battery subpack sends a first message with the first address to the master controller.

A battery system according to another aspect of the disclosure is provided. The battery system includes a first battery subpack having first and second battery cells electrically coupled in series to one another, a cell monitoring circuit, and a subpack microprocessor. The cell monitoring circuit of the first battery subpack is operably coupled to the first and second battery cells thereof. The subpack microprocessor of the first battery subpack operably communicates with the cell monitoring circuit thereof. The cell monitoring circuit of the first battery subpack measures first and second voltages of the first and second battery cells, respectively, thereof to obtain first and second voltage values, respectively. The battery system further includes a first switch circuit that is electrically coupled to the subpack microprocessor of the first battery subpack. The first switch circuit applies an operational voltage to the subpack microprocessor of the first battery subpack when the first switch circuit receives a first control signal from a master controller. The master controller sends a first message that requests the first and second voltage values from the subpack microprocessor of the first battery subpack. The master controller stops generating the first control signal to induce the first switch circuit to remove the operational voltage from the subpack microprocessor of the first battery subpack when the master controller does not receive a second message having the first and second voltage values from the subpack microprocessor of the first battery subpack within a first predetermined amount of time after sending the first message.

A battery system according to another aspect of the disclosure is provided. The battery system includes a first battery subpack having first and second battery cells electrically coupled in series to one another, a cell monitoring circuit, a subpack microprocessor, and first and second subpack contactors. The cell monitoring circuit of the first battery subpack is operably coupled to the first and second battery cells thereof. The subpack microprocessor of the first battery subpack operably communicates with the cell monitoring circuit thereof. The cell monitoring circuit of the first battery subpack measures first and second voltages of the first and second battery cells, respectively, thereof to obtain first and second voltage values, respectively. The subpack microprocessor receives a first message requesting the first and second voltage values of the first battery subpack from a master controller. The subpack microprocessor of the first battery subpack sends a second message having the first and second voltage values of the first battery subpack to the master controller. The subpack microprocessor of the first battery subpack induces the first and second subpack contactors of the first battery subpack to each have an open operational state when the subpack microprocessor of the first battery subpack does not receive a third message from the master controller acknowledging receipt of the second message with a predetermined amount of time after sending the second message.

BRIEF DESCRIPTION OF THE DRAWINGS

FIGS. 7-8 are flowcharts illustrating functionality of a master controller utilized in the battery system of FIG. 1;

FIGS. 11-12 are flowcharts illustrating functionality of a second battery subpack utilized in the battery system of FIG. 1.

DETAILED DESCRIPTION

Figure 1:
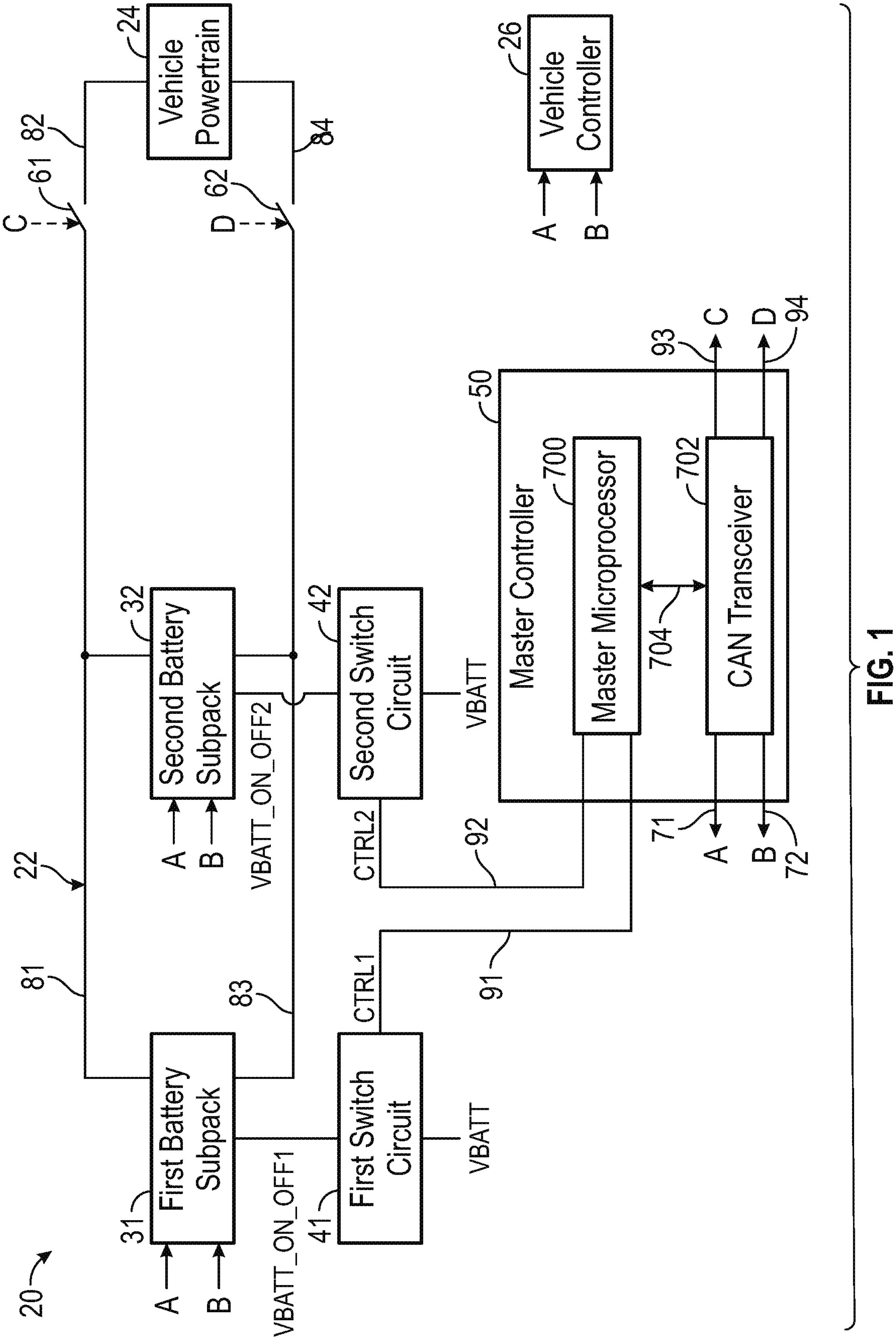
FIG. 1 is a schematic of a vehicle having a battery system according to aspects of the disclosure.

Referring to FIG. 1, a vehicle 20 having a battery system 22, a vehicle powertrain 24, a vehicle controller 26 is provided.

The term "contactor" means an electrically controlled switch used for switching an electrical power circuit. A contactor can conduct a relatively large electrical current therethrough that is useful in electric vehicle applications.

The term "RF signal" means a radio frequency signal. In particular, an RF signal is transmitted across space without the need for electrical wires.

The battery system 22 provides electrical energy to the vehicle powertrain 24 in response to commands from the vehicle controller 26. The battery system 22 includes a first battery subpack 31, a second battery subpack 32, a first switch circuit 41, a second switch circuit 42, a master controller 50, a first pack contactor 61, a second pack contactor 62, communication lines 71, 72, and electrical lines 81, 82, 83, 84, 91, 92, 93, 94.

Figure 2:
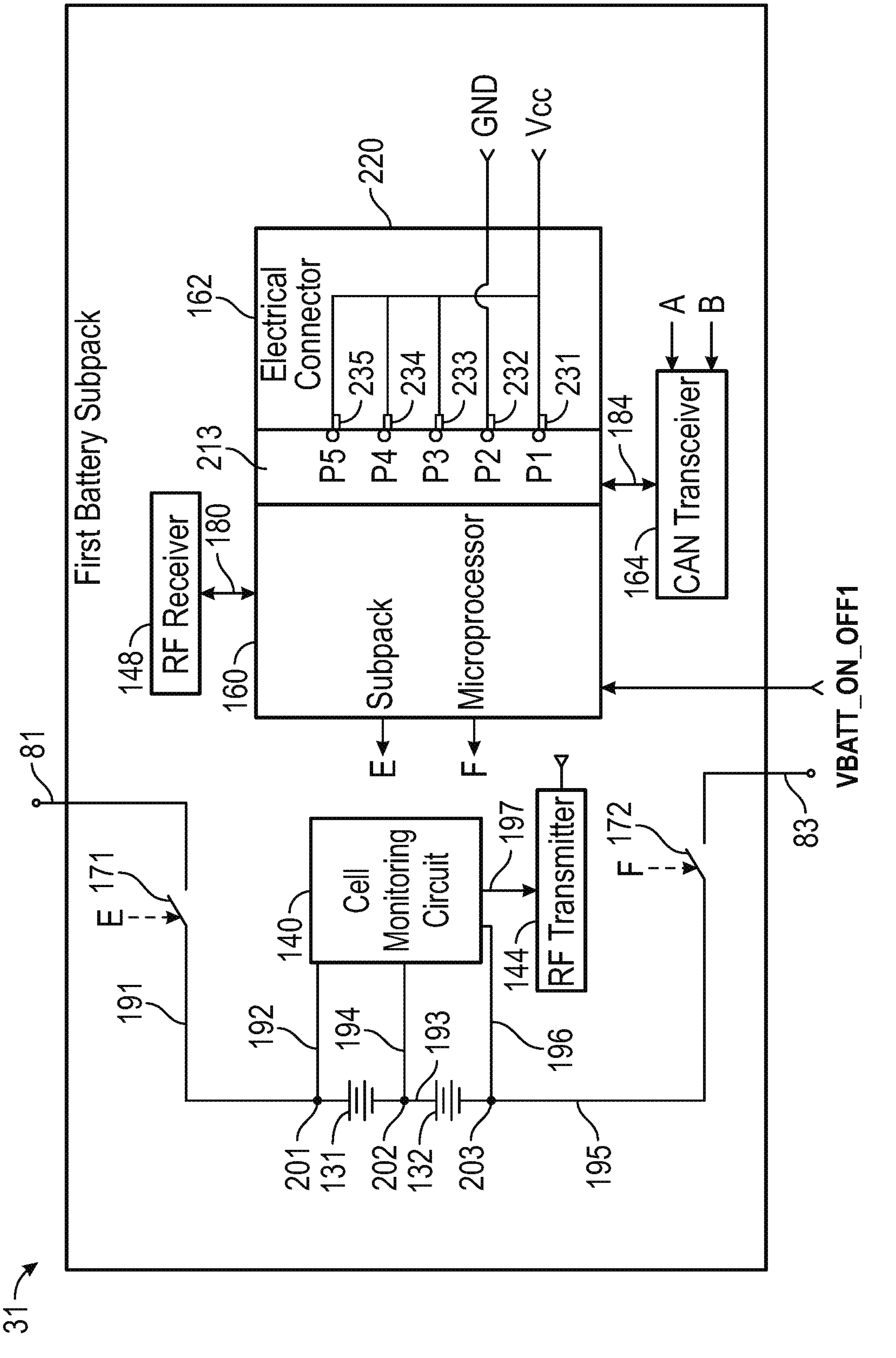
FIG. 2 is a block diagram of a first battery subpack utilized in the battery system of FIG. 1.

Referring to FIGS. 1 and 2, an advantage of the battery system 22 is that the system 22 utilizes a first switch circuit 41 operably coupled between a master controller 50 and a first battery subpack 31 that allows the master controller 50 to apply an operational voltage to the subpack microprocessor 160 (shown in FIG. 2) in the first battery subpack 31 to obtain the address of the first battery subpack 31. Further, the battery system 22 allows the master controller 50 to utilize the first switch circuit 41 to remove the operational voltage from the subpack microprocessor 160 when a communication fault occurs between the master controller 50 and the subpack microprocessor 160 which opens the first and second battery subpack contactors 171, 172 in the first battery subpack 31 to electrically decouple the first battery subpack 31 from the other battery subpacks and the vehicle powertrain 24.

First Battery Subpack

The first battery subpack 31 is electrically coupled in parallel to the second battery subpack 32. The first battery subpack 31 includes a first battery cell 131, a second battery cell 132, a cell monitoring circuit 140, an RF transmitter 144, an RF receiver 148, a subpack microprocessor 160, an electrical connector 162 a CAN (i.e., Controller Area Network) transceiver 164, a first subpack contactor 171, a second subpack contractor 172, a communication bus 180, electrical lines 191, 192, 193, 194, 195, 196, 197 and electrical nodes 201, 202, 203.

Referring to FIG. 2, the first and second battery cells 131, 132 are electrically coupled in series to one another and are provided to output a voltage therefrom. In particular, the first battery cell 131 has a positive terminal electrically coupled to the electrical node 201 and the electrical lines 191, 192. Further, the first battery cell 131 has a negative terminal that is electrically coupled to the electrical node 202 and the electrical lines 193, 194. The second battery cell 132 has a positive terminal electrically coupled to the electrical node 202 and the electrical lines 193, 194. Further, the second battery cell 132 has a negative terminal electrically coupled to the electrical node 203, and the electrical lines 195, 196. Of course, alternately additional battery cells could be electrically coupled in series with the first and second battery cells 131, 132.

The cell monitoring circuit 140 is electrically coupled to the electrical lines 192, 194, 196, and to the RF transmitter 144 via the electrical line 197. The cell monitoring circuit 140 is provided to measure a voltage that is output by the first battery cell 131 and a voltage output by the second battery cell 132. In particular, the cell monitoring circuit 140 measures the voltage output by the first battery cell 131 utilizing the electrical lines 192, 194 and sends a voltage value corresponding to the voltage of the first battery cell 131 to the RF transmitter 144. The RF transmitter 144 transmits an RF signal with the voltage value therein to the RF receiver 148. Further, the cell monitoring circuit 140 measures the voltage output by the second battery cell 132 utilizing the electrical lines 194, 196 and sends a voltage value corresponding to the voltage of the second battery cell 132 to the RF transmitter 144. The RF transmitter 144 transmits an RF signal with the voltage value therein to the RF receiver 148.

The RF receiver 148 is provided to receive RF signals from the RF transmitter 144 having voltage values therein and to send the voltage values to the subpack microprocessor 160. The RF receiver 148 operably communicates with the subpack microprocessor 160 via the communication bus 180.

Referring to FIGS. 1 and 2, the subpack microprocessor 160 is provided to monitor the voltages of the first and second battery cells 131, 132, to communicate messages to the master controller 50. In particular, the subpack microprocessor 160 sends a message having the first and second voltage values, associated with the first and second battery cells 131, 132 to the master controller 50 utilizing the CAN transceiver 164. In particular, the CAN transceiver 164 communicates with the CAN transceiver 702 in the master controller 50 utilizing the communication lines 71, 72. Further the subpack microprocessor 160 is provided to control an operational state of each of the first and second subpack contactors 171, 172. In particular, the subpack microprocessor 160 generates first and second control signals E, F to induce the first and second subpack contactors 171, 172, respectively to have a closed operational state. The subpack microprocessor 160 stops generating the first and second control signals E, F to induce the first and second subpack contactors 171, 172, respectively to have an open operational state.

The subpack microprocessor 160 is operably coupled to the RF receiver 148, the CAN transceiver 164, the first subpack contactor 171, and the second subpack contactor 172. In particular, the subpack microprocessor 160 operably communicates with the RF receiver 148 via the communication bus 180. Further, the subpack microprocessor 160 operably communicates with the CAN transceiver 164 via the communication bus 184.

Figure 3:
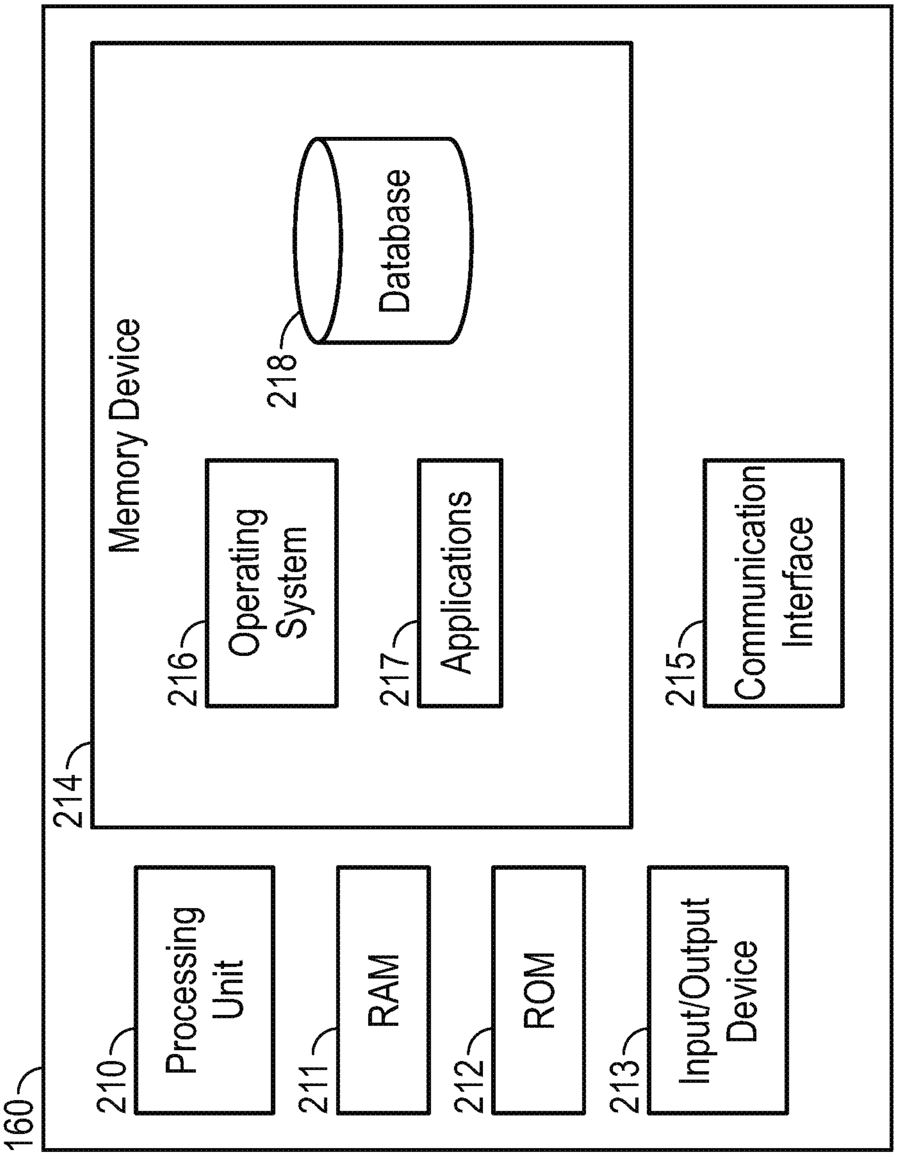
FIG. 3 is a block diagram of a subpack microprocessor utilized in the first battery subpack of FIG. 2.

Referring to FIG. 3, the subpack microprocessor 160 includes a processing unit 210 for controlling overall operation of the microprocessor 160 and its associated components, including a random access memory (RAM) 211, a read only memory (ROM) 212, an input/output device 213, a memory device 214, and a communication interface 215. A data bus may interconnect the processing unit 210, the RAM 211, the ROM 212, the I/O device 213, the memory device 214, and the communication interface 215.

Software may be stored within the memory device 214 to provide instructions to the processing unit 210 allowing the microprocessor 160 to perform various actions. The memory device 214 may store software used by the microprocessor 160 such as an operating system 216, application programs 217, and an associated internal database 218. The various hardware memory units in the memory device 214 may include volatile and nonvolatile, removable and non-removable media implemented in any method or technology for storage of information such as computer-readable instructions, data structures, program modules, or other data. The memory device 214 may include one or more physical persistent memory devices and/or one or more non-persistent memory devices. The memory device 14 may include, but is not limited to, the RAM 211, the ROM 212, an electronically erasable programmable read only memory (EEPROM), flash memory or any other medium that may be used to store the desired information and that may be accessed by the processing unit 210.

Referring to FIGS. 1 and 2, the input/output device 213 includes ports P1, P2, P3, P4, P5. The input/output device 213 is electrically coupled to the electrical connector 162. In particular, the electrical connector 162 has electrical pins 231, 232, 233, 234, 235 that are electrically coupled to the ports P1, P2, P3, P4, P5, respectively of the input/output device 213. Respective voltages on the electrical pins 231, 233, 234, 235 are utilized to specify the address of the subpack's microprocessor 160. In an exemplary embodiment, the electrical pins 231, 233, 234, 235 are coupled to a voltage VBATT, and the electrical pin 232 is coupled to a ground voltage to specify the address of the subpack microprocessor 160 as binary value 10111. The subpack microprocessor 160 determines the address 10111 by reading the voltages on the ports P1, P2, P3, P4, P5 thereof.

The first subpack contactor 171 is electrically coupled to the electrical node 201 via the electrical line 191. Further, the first subpack contactor 171 is electrically coupled to the first pack contactor 61 via the electrical line 81.

The second subpack contactor 172 is electrically coupled to the electrical node 203 via the electrical line 195. Further, the second subpack contactor 172 is electrically coupled to the second pack contactor 62 via the electrical line 83.

Second Battery Subpack

Figure 4:
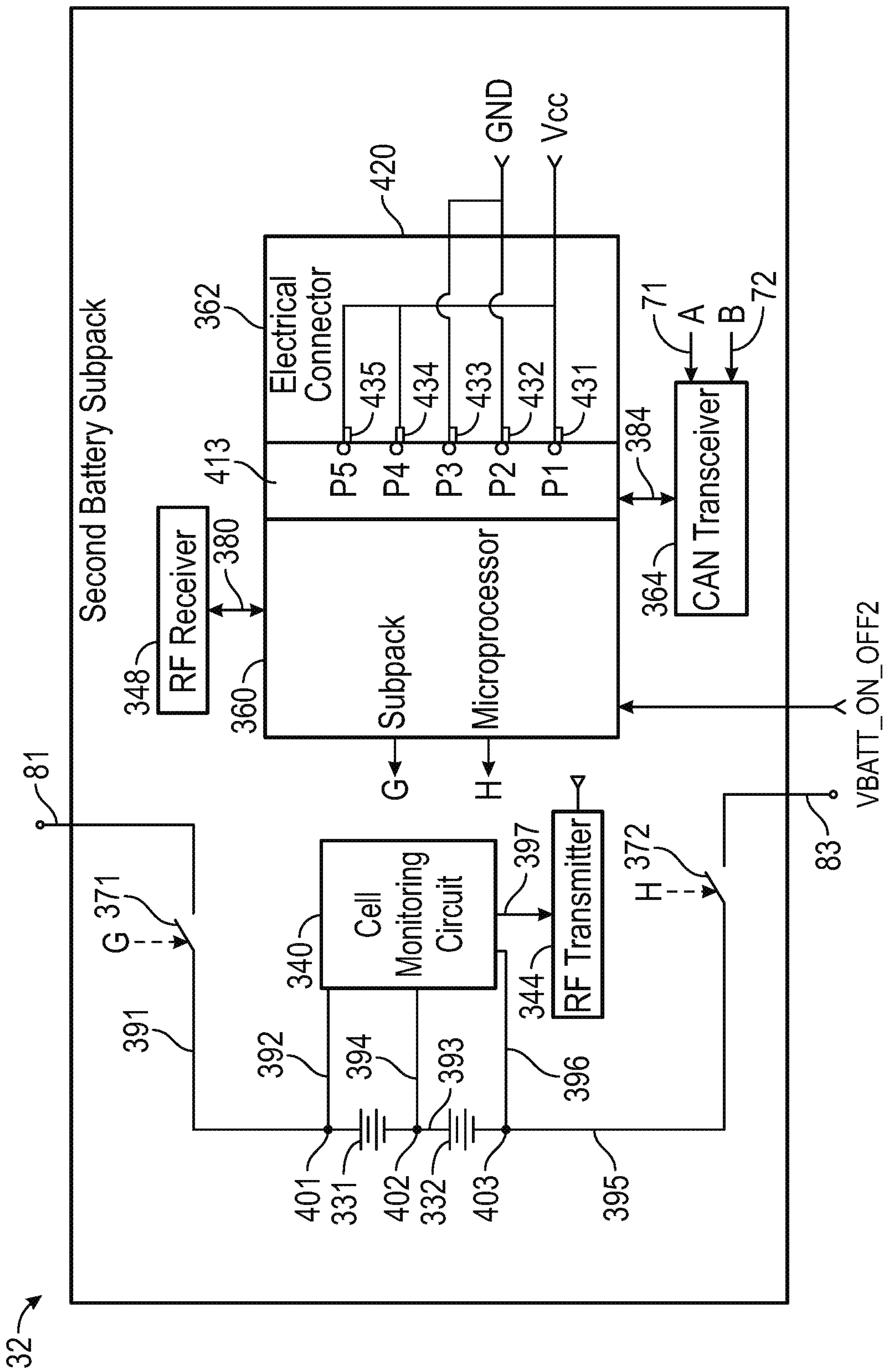
FIG. 4 is a block diagram of a second battery subpack utilized in the battery system of FIG. 1.

Referring to FIGS. 1 and 4, the second battery subpack 32 is electrically coupled in parallel with the first battery subpack 31. The second battery subpack 32 includes a first battery cell 331, a second battery cell 332, a cell monitoring circuit 340, an RF transmitter 344, an RF receiver 348, a subpack microprocessor 360, an electrical connector 362 a CAN transceiver 364, a first subpack contactor 371, a second subpack contractor 372, a communication bus 380, electrical lines 391, 392, 393, 394, 395, 396, 397 and electrical nodes 401, 402, 403.

Referring to FIG. 4, the first and second battery cells 331, 332 are electrically coupled in series to one another and are provided to output a voltage therefrom. In particular, the first battery cell 331 has a positive terminal electrically coupled to the electrical node 401 and the electrical lines 391, 392. Further, the first battery cell 331 has a negative terminal that is electrically coupled to the electrical node 402 and the electrical lines 393, 394. The second battery cell 332 has a positive terminal electrically coupled to the electrical node 402 and the electrical lines 393, 394. Further, the second battery cell 332 has a negative terminal electrically coupled to the electrical node 403, the electrical lines 395, 396. Of course, alternately additional battery cells could be electrically coupled in series with the first and second battery cells 331, 332.

The cell monitoring circuit 340 is electrically coupled to the electrical lines 392, 394, 396, and to the RF transmitter 344 via the electrical line 397. The cell monitoring circuit 340 is provided to measure a voltage that is output by the first battery cell 331 and a voltage output by the second battery cell 332. In particular, the cell monitoring circuit 340 measures the voltage output by the first battery cell 331 utilizing the electrical lines 392, 394 and sends a voltage value corresponding to the voltage of the first battery cell 331 to the RF transmitter 344. The RF transmitter 344 transmits an RF signal with the voltage value therein to the RF receiver 348. Further, the cell monitoring circuit 340 measures the voltage output by the second battery cell 332 utilizing the electrical lines 394, 396 and sends a voltage value corresponding to the voltage of the second battery cell 332 to the RF transmitter 344. The RF transmitter 344 transmits an RF signal with the voltage value therein to the RF receiver 348.

The RF receiver 348 is provided to receive RF signals from the RF transmitter 344 having voltage values therein and to send the voltage values to the subpack microprocessor 360. The RF receiver 348 operably communicates with the subpack microprocessor 360 via the communication bus 380.

Referring to FIGS. 1, 2 and 4, the subpack microprocessor 360 has an identical configuration and components as the subpack microprocessor 160 described above and includes a random access memory, a read only memory, an input/output device 413, a memory device, and a communication interface. The subpack microprocessor 360 is provided to monitor the voltages of the first and second battery cells 331, 332, to communicate messages to the master controller 50. The subpack microprocessor 360 sends a message having the first and second voltage values, associated with the first and second battery cells 331, 332 to the master controller 50 utilizing the CAN transceiver 364. In particular, the CAN transceiver 364 communicates with the CAN transceiver 702 in the master controller 50 utilizing the communication lines 71, 72. Further the subpack microprocessor 360 is provided to control an operational state of each of the first and second subpack contactors 371, 372. In particular, the subpack microprocessor 360 generates first and second control signals G, H to induce the first and second subpack contactors 371, 372, respectively to have a closed operational state. The subpack microprocessor 360 stops generating the first and second control signals G, H to induce the first and second subpack contactors 371, 372, respectively to have an open operational state.

Referring to FIG. 4, the input/output device 413 includes ports P1, P2, P3, P4, P5. The input/output device 413 is electrically coupled to the electrical connector 362. In particular, the electrical connector 362 has electrical pins 431, 432, 433, 434, 435 that are electrically coupled to the ports P1, P2, P3, P4, P5, respectively of the input/output device 413. Respective voltages on the electrical pins 431, 433, 434, 435 are utilized to specify the address of the subpack microprocessor 360. In an exemplary embodiment, the electrical pins 431, 434, 435 are coupled to a voltage VBATT, and the electrical pins 432, 433 are coupled to a ground voltage to specify the address of the subpack microprocessor 160 as binary value 10011. The subpack microprocessor 360 determines the address 10011 by reading the voltages on the ports P1, P2, P3, P4, P5 thereof.

Referring to FIGS. 1 and 4, the first subpack contactor 371 is electrically coupled to the electrical node 401 via the electrical line 391. Further, the first subpack contactor 371 is electrically coupled to the first pack contactor 61 via the electrical line 81.

The second subpack contactor 372 is electrically coupled to the electrical node 403 via the electrical line 395. Further, the second subpack contactor 372 is electrically coupled to the second pack contactor 62 via the electrical line 83.

First Switch Circuit

Referring to FIGS. 1, 2, and 4, the first switch circuit 41 is electrically coupled to and between the master controller 50 and the first battery subpack 31. The first switch circuit 41 applies an operational voltage VBATT_ON_OFF1 to the subpack microprocessor 160 of the first battery subpack 31 when the first switch circuit 41 receives a first control signal CTRL1 from the master controller 50. Further, the first switch circuit 41 stops applying the operational voltage VBATT_ON_OFF1 to the subpack microprocessor 160 of the first battery subpack 31 when the first switch circuit 41 stops receiving the first control signal CTRL1 from the master controller 50.

Figure 5:
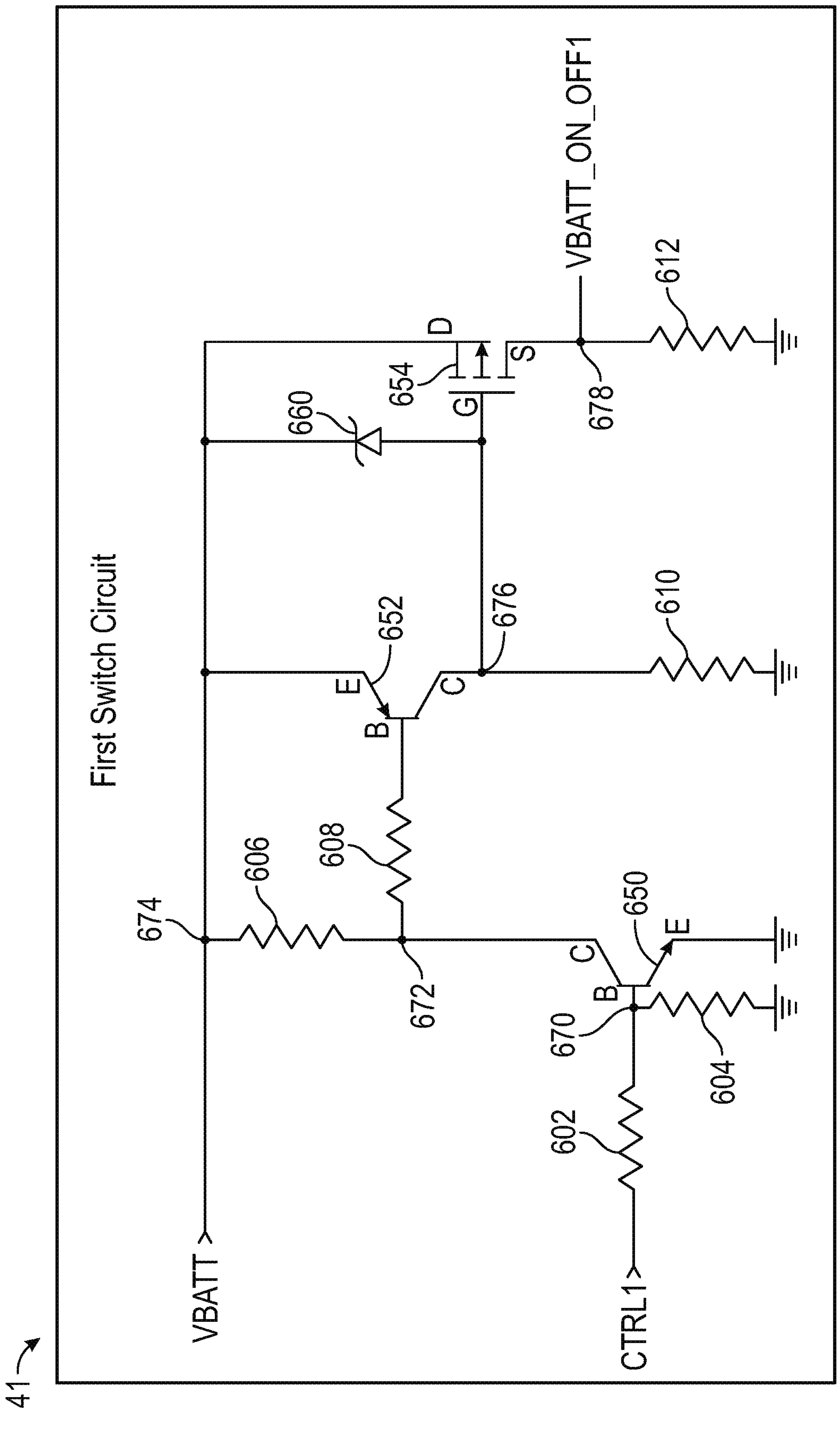
FIG. 5 is a circuit schematic of a first switch circuit utilized in the battery system of FIG. 1.

Referring to FIGS. 4 and 5, the first switch circuit 41 includes resistors 602, 604, 606, 608, 610, 612, transistors 650, 652, 654, electrical nodes 670, 672, 674, 676, 678. The resistor 602 is electrically coupled to the electrical node 670. The resistor 604 is electrically coupled between the electrical node 670 and electrical ground.

The transistor 650 is an NPN bipolar junction transistor having a base B, a collector C, and an emitter E. The base B of the transistor 650 is electrically coupled to the electrical node 670. The emitter E of the transistor 650 is electrically coupled to electrical ground. The collector C of the transistor 650 is electrically coupled to the electrical node 672. The resistor 606 is electrically coupled between the electrical nodes 672, 674.

The transistor 652 is a PNP bipolar junction transistor having a base B, a collector C, and an emitter E. The base B of the transistor 652 is electrically coupled to the resistor 608. The resistor 608 is electrically coupled between the electrical node 672 and the base B of the transistor 652. The emitter E of the transistor 652 is electrically coupled to electrical node 674. The collector C of the transistor 652 is electrically coupled to the electrical node 676.

The transistor 654 is a P-channel MOSFET which includes a gate G, a drain D, and a source S. The gate G is electrically coupled to the electrical node 676 and the Zener diode 660. The Zener diode 660 is electrically coupled between the electrical nodes 676, 674. The drain D is electrically coupled to the electrical node 674. The source S is electrically coupled to the electrical node 678 and the resistor 612. The resistor 612 is electrically coupled between the electrical node 678 and electrical ground.

During operation, the voltage VBATT is applied to the electrical node 674. When a control signal CTRL1 (which has a high logic level) is applied to the resistor 602, the transistor 650 is turned on. Further, the transistor 652 was turned on. Also, the transistor 654 is turned on which applies an operational voltage VBATT_ON_OFF1 to the first battery subpack 31. When the control signal CTRL1 is not applied to the resistor 602, the transistor 650 is turned off. Further, the transistor 652 was turned off. Also, the transistor 654 is turned off such that the voltage VBATT_ON_OFF1 is no longer applied to the first battery subpack 31.

Second Switch Circuit

Referring to FIG. 1, The second switch circuit 42 is electrically coupled to and between the master controller 50 and the second battery subpack 32. The second switch circuit 42 applies an operational voltage VBATT_ON_OFF2 to the subpack microprocessor 360 of the second battery subpack 32 when the second switch circuit 42 receives a second control signal CTRL2 from the master controller 50. Further, the second switch circuit 42 stops applying the operational voltage VBATT_ON_OFF2 to the subpack microprocessor 360 of the second battery subpack 32 when the second switch circuit 42 stops receiving the second control signal CTRL2 from the master controller 50. The second switch circuit 42 has identical configuration and components as the first switch circuit 41.

Master Controller

The master controller 50 is provided to communicate with the first and second battery subpacks 31, 32 and the vehicle controller 26. Further, the master controller 50 is provided to control an operational state of the first and second pack contactors 61, 62 for controlling whether an operational voltage is applied to the vehicle powertrain 24. In particular, the master controller 50 generates third and fourth control signals C, D to induce the first and second pack contactors 61, 62, respectively to have a closed operational state. Alternately, when the master controller 50 stops generating the third and fourth control signals C, D, the first and second pack contactors 61, 62, respectively transition to an open operational state. The master controller 50 includes a master microprocessor 700, a CAN transceiver 702, and a communication bus 704. The master microprocessor 700 is operably coupled to the CAN transceiver 702 utilizing the communication bus 704. The CAN transceiver 702 operably communicates with the CAN transceiver 164 in the first battery setback 31 utilizing the communication lines 71, 72 with signals A, B which communicate CAN messages between the CAN transceiver 702 and the CAN transceiver 164. Further, the CAN transceiver 702 operably communicates with the CAN transceiver 364 in the second battery setback 32 utilizing the communication lines 71, 72 with signals A, B which communicate CAN messages between the CAN transceiver 702 and the CAN transceiver 364. Also, the CAN transceiver 702 operably communicates with the vehicle controller 26 utilizing the communication lines 71, 72 with signals A, B which communicate CAN messages between the CAN transceiver 702 and the vehicle controller 26. The master microprocessor 700 has an identical configuration and components as the subpack microprocessor 160.

The vehicle powertrain 24 receives a voltage from the first battery subpack 31 when the first and second subpack contactors 171, 172 have a closed operational state, and the first and second pack contactors 61, 62 have a closed operational state. Further, the vehicle powertrain 24 receives a voltage from the second battery subpack 32 when the first and second subpack contactors 371, 372 have a closed operational state, and the first and second pack contactors 61, 62 have a closed operational state. The vehicle powertrain 24 utilizes the voltage for powering components in the vehicle powertrain 24.

The vehicle controller 26 operably communicates with the master controller 50 and provides instructions to the master controller 50 for obtaining operational information from the first and second battery subpacks 31, 32. The vehicle controller 26 further controls operation of the vehicle powertrain 24.

Figure 6:
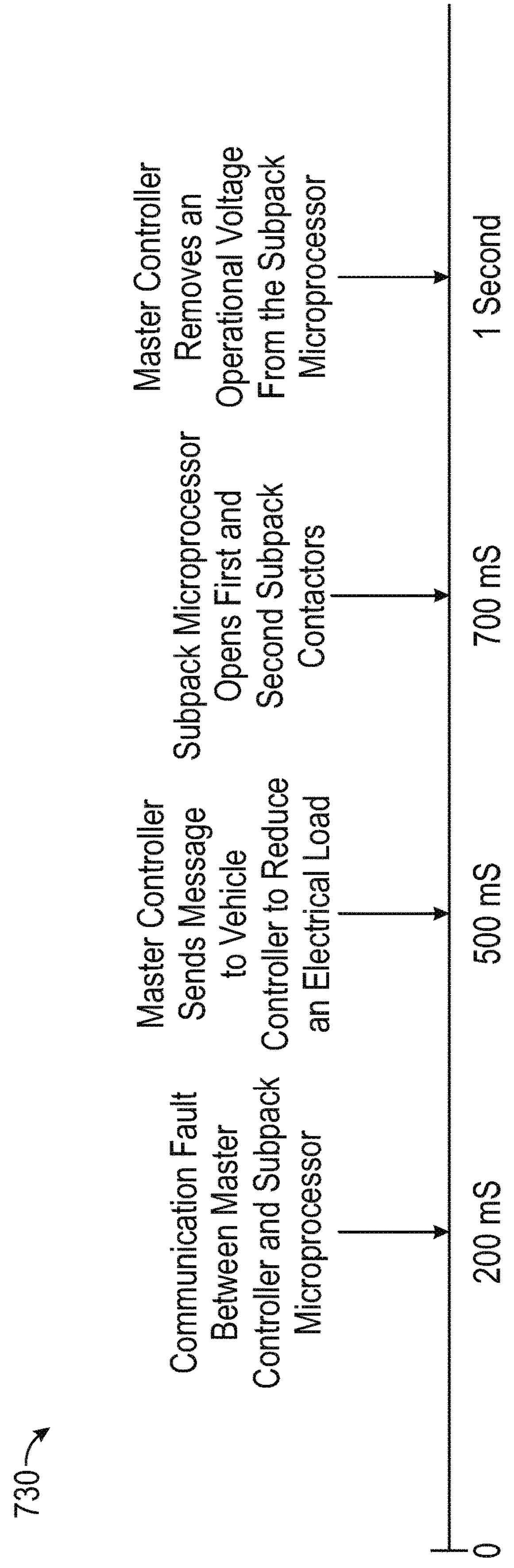
FIG. 6 is a timeline diagram illustrating actions taken by the battery system of FIG. 1.
Figure 8:
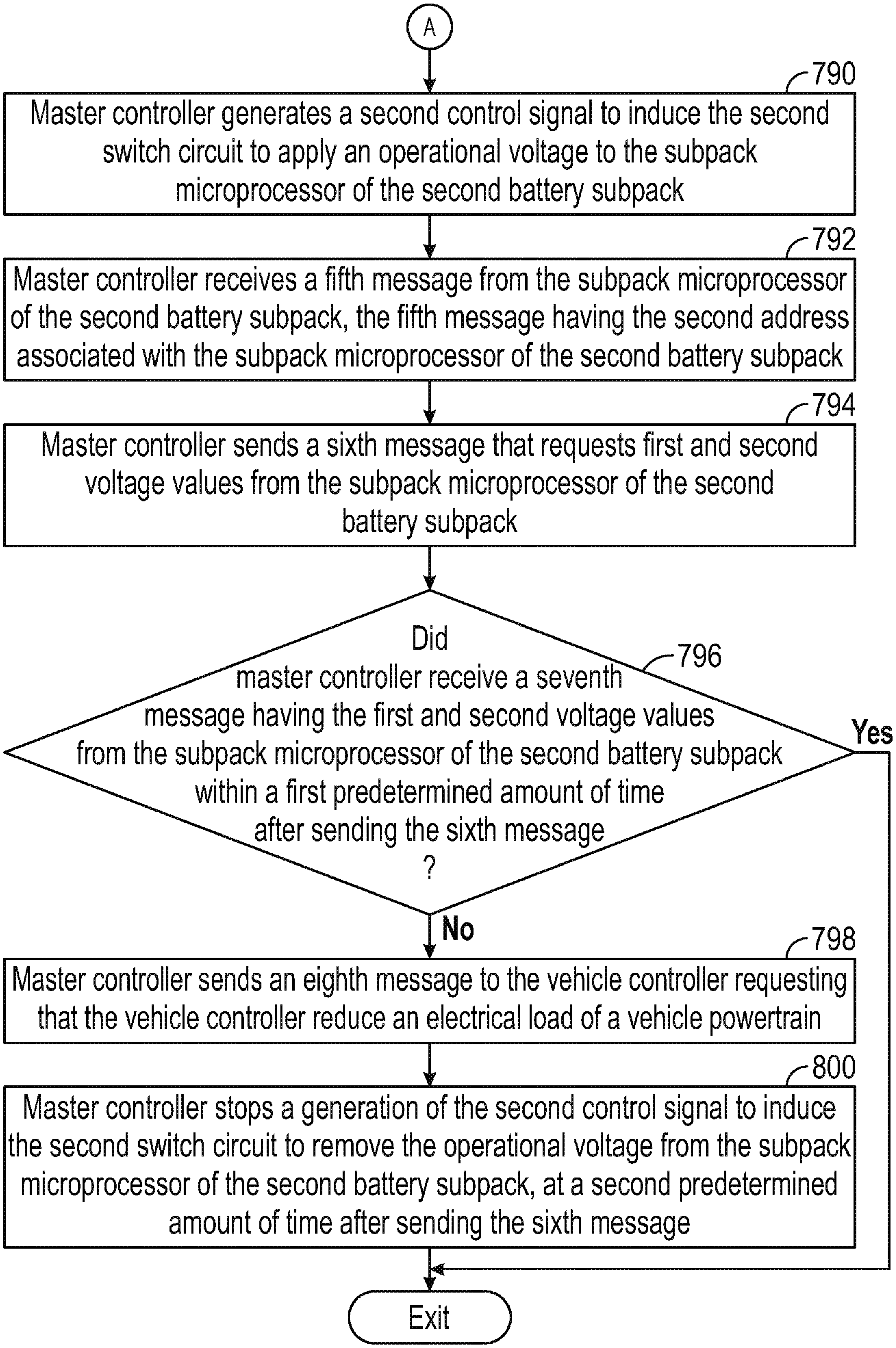
Figure 9:
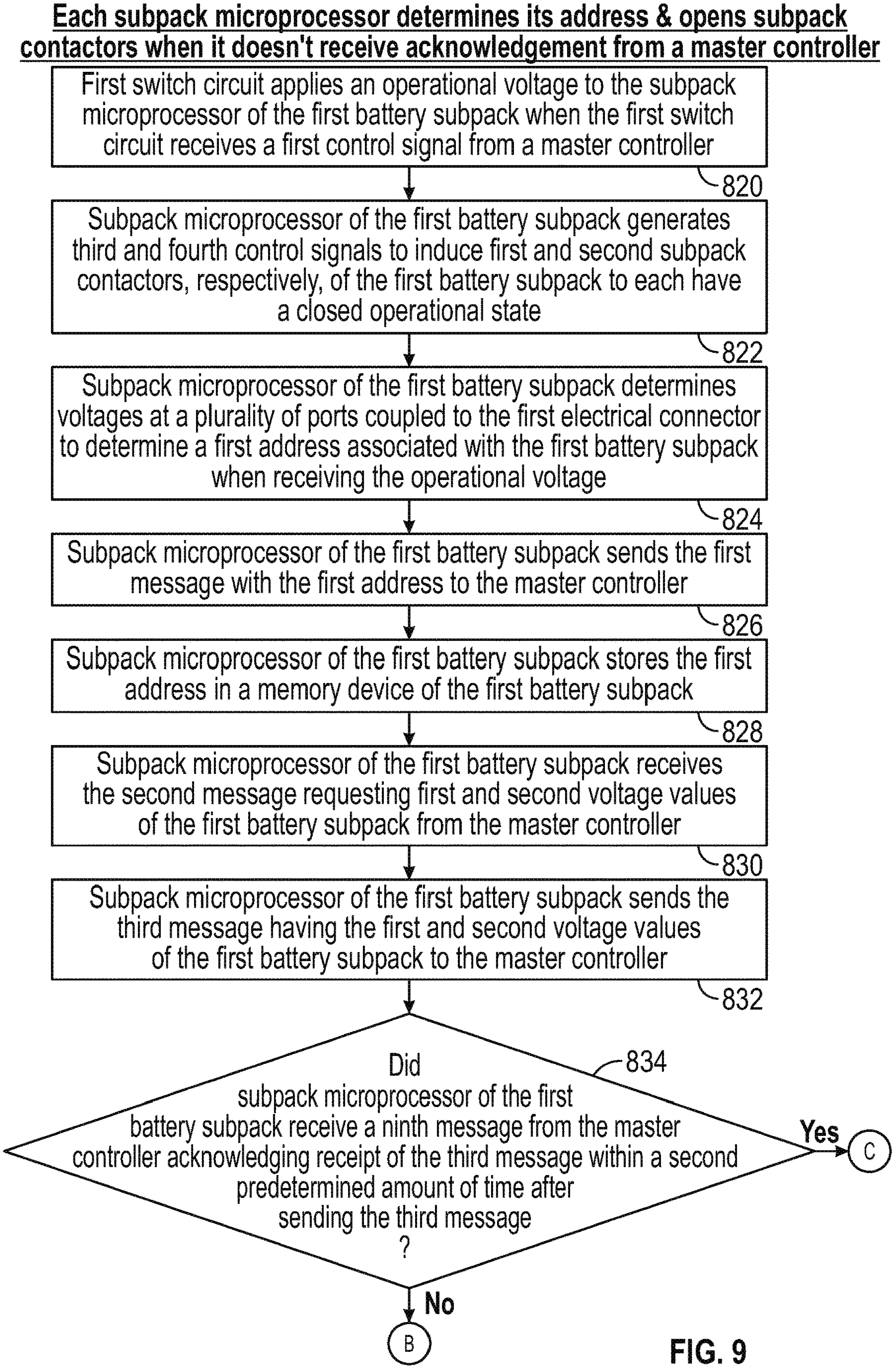
FIGS. 9-10 are flowcharts illustrating functionality of a first battery subpack utilized in the battery system of FIG. 1.
Figure 10:
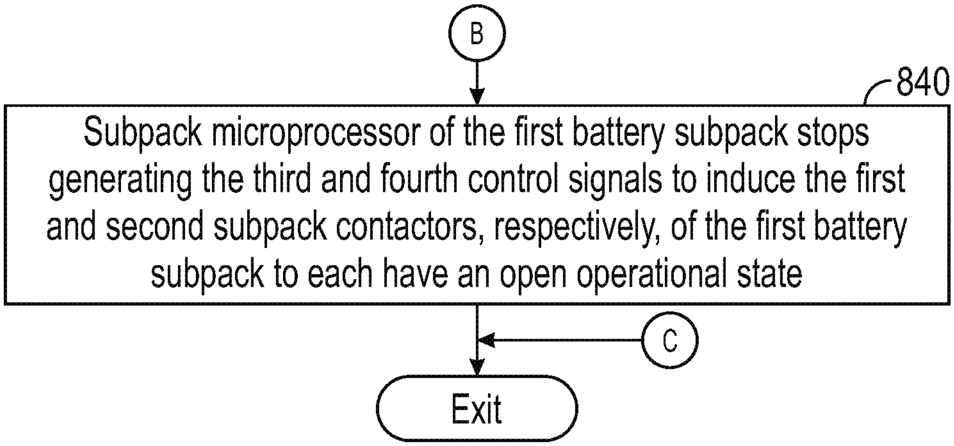
Figure 12:
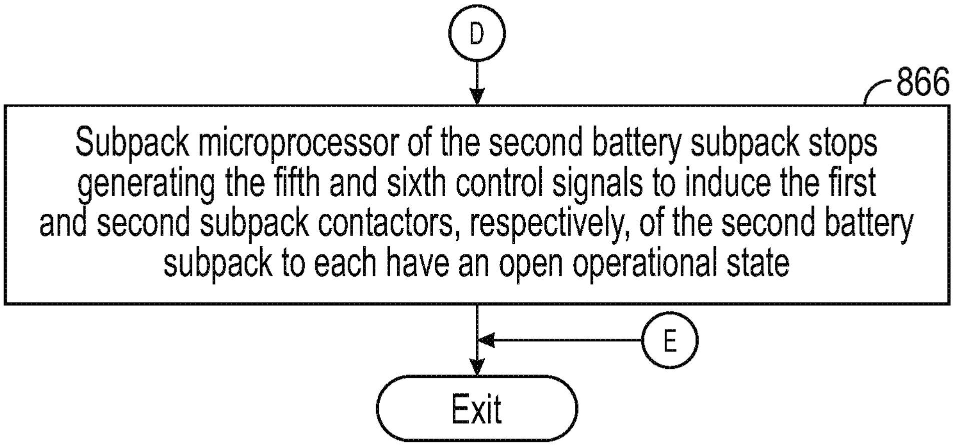

Referring to FIGS. 1, 2 and 6, an exemplary timing diagram 730 associated with the first battery pack 31 and the master controller 50 will be explained. At 200 milliseconds, the communication fault occurs between the master controller 50 and the subpack microprocessor 160. At 500 milliseconds, the master controller 50 sends a message to the vehicle controller 26 to reduce an electrical load of the vehicle powertrain 24. At 700 milliseconds, the subpack microprocessor 160 opens the first and second subpack contactors 171, 172. At 1 second, the master controller 50 removes an operational voltage from the subpack microprocessor 160 in the first battery subpack 31.

Flowchart

Referring to FIGS. 1, 2, 4 and 7, a flowchart illustrating functionality of a master controller 50 utilized in the battery system 22 will now be explained.

At step 770, the master controller 50 generates a first control signal CTRL1 to induce the first switch circuit 41 to apply an operational voltage VBATT_ON_OFF1 to the subpack microprocessor 160 of the first battery subpack 31. After step 770, the method advances to step 772.

At step 772, the master controller 50 receives a first message from the subpack microprocessor 160 of the first battery subpack 31. The first message has the first address associated with the subpack microprocessor 160 of the first battery subpack 31. After step 772, the method advances to step 774.

At step 774, the master controller 50 sends a second message that requests first and second voltage values from the subpack microprocessor 160 of the first battery subpack 31. After step 774, the method advances to step 776.

At step 776, the master controller 50 determines whether the master controller 50 received a third message having the first and second voltage values from the subpack microprocessor 160 of the first battery subpack 31 within a first predetermined amount of time after sending the second message. If the value of step 776 equals "no", the method advances to step 778. Otherwise, the method advances to step 790.

At step 778, the master controller 50 sends a fourth message to the vehicle controller 26 requesting that the vehicle controller 26 reduce an electrical load of a vehicle powertrain 24. After step 778, the method advances to step 780.

At step 780, the master controller 50 stops a generation of the first control signal CTRL1 to induce the first switch circuit 41 to remove the operational voltage VBATT_ON_OFF1 from the subpack microprocessor 160 of the first battery subpack 31, at a second predetermined amount of time after sending the second message. After step 780, the method advances to step 790.

Referring again to step 776, if the value of step 776 equals "yes", the method advances to step 790. At step 790, the master controller 50 generates a second control signal CTRL2 to induce the second switch circuit 42 to apply an operational voltage VBATT_ON_OFF2 to the subpack microprocessor 360 of the second battery subpack 42. After step 790, the method advances to step 792.

At step 792, the master controller 50 receives a fifth message from the subpack microprocessor 360 of the second battery subpack 42. The fifth message has the second address associated with the subpack microprocessor 360 of the second battery subpack 42. After step 792, the method advances to step 794.

At step 794, the master controller 50 sends a sixth message that requests first and second voltage values from the subpack microprocessor 360 of the second battery subpack 42. After step 794, the method advances to step 796.

At step 796, the master controller 50 determines whether the master controller 50 received a seventh message having the first and second voltage values from the subpack microprocessor 360 of the second battery subpack 42 within a first predetermined amount of time after sending the sixth message. If the value of step 796 equals "no", the method advances to step 798. Otherwise, the method is exited.

At step 798, the master controller 50 sends an eighth message to the vehicle controller 26 requesting that the vehicle controller 26 reduce an electrical load of a vehicle powertrain 24. After step 798, the method advances to step 800.

At step 800, the master controller 50 stops a generation of the second control signal CTRL2 to induce the second switch circuit 42 to remove the operational voltage VBATT_ON_OFF2 from the subpack microprocessor 360 of the second battery subpack 42, at a second predetermined amount of time after sending the sixth message. After step 800, the method is exited.

Flowchart

Referring to FIGS. 1, 2, 4, 9 and 10, a flowchart illustrating functionality of the subpack microprocessor 160 of the first battery subpack 31 during initial startup will now be explained.

At step 820, the first switch circuit 41 applies an operational voltage VBATT_ON_OFF1 to the subpack microprocessor 160 of the first battery subpack 31 when the first switch circuit 41 receives a first control signal CTRL1 from a master controller 50. After step 820, the method advances to step 822.

At step 822, the subpack microprocessor 160 of the first battery subpack 31 generates third and fourth control signals to induce first and second subpack contactors 171, 172, respectively, of the first battery subpack 31 to each have a closed operational state. After step 822, the method advances to step 824.

At step 824, the subpack microprocessor 160 of the first battery subpack 31 determines voltages at a plurality of ports P1, P2, P3, P4, P5 coupled to the first electrical connector 162 to determine a first address associated with the first battery subpack 31 when receiving the operational voltage. After step 824, the method advances to step 826.

At step 826, the subpack microprocessor 160 of the first battery subpack 31 sends the first message with the first address to the master controller 50. After step 826, the method advances to step 828.

At step 828, the subpack microprocessor 160 of the first battery subpack 31 stores the first address in a memory device 214 of the first battery subpack 31. After step 828, the method advances step 830.

At step 830, the subpack microprocessor 160 of the first battery subpack 31 receives the second message requesting first and second voltage values of the first battery subpack 31 from the master controller 50. After step 830, the method advances to step 832.

At step 832, the subpack microprocessor 160 of the first battery subpack 31 sends the third message having the first and second voltage values of the first battery subpack to the master controller 50. After step 832, the method advances to step 834.

At step 834, the subpack microprocessor 160 of the first battery subpack 31 determines whether the subpack microprocessor 160 received a ninth message from the master controller 50 acknowledging receipt of the third message with a second predetermined amount of time after sending the third message. If the value of step 834 equals "no", the method advanced to step 840. Otherwise, the method is exited.

At step 840, the subpack microprocessor 160 of the first battery subpack 31 stops generating the third and fourth control signals to induce the first and second subpack contactors 171, 172, respectively, of the first battery subpack 31 to each have an open operational state. After step 840, the method is exited.

Flowchart

Referring to FIGS. 1, 2, 4, 11 and 12, a flowchart illustrating functionality of the subpack microprocessor 360 of the second battery subpack 32 during initial setup will now be explained.

At step 850, the second switch circuit 42 applies an operational voltage VBATT_ON_OFF2 to the subpack microprocessor 360 of the second battery subpack 42 when the second switch circuit 42 receives the second control signal CTRL2 from the master controller 50. After step 850, the method advances to step 852.

At step 852, the subpack microprocessor 360 of the second battery subpack 42 generates fifth and sixth control signals to induce first and second subpack contactors 371, 372, respectively, of the second battery subpack 42 to each have a closed operational state. After step 852, the method advances to step 854.

At step 854, the subpack microprocessor 360 of the second battery subpack 42 determines voltages at a plurality of ports P1, P2, P3, P4, P5 coupled to the second electrical connector 362 to determine a second address associated with the second battery subpack 42 when receiving the operational voltage thereof. After step 854, the method advances to step 856.

At step 856, the subpack microprocessor 360 of the second battery subpack 42 sends the fifth message with the second address to the master controller 50. After step 856, the method advances to step 858.

At step 858, the subpack microprocessor 360 of the second battery subpack 42 stores the second address in a memory device of the second battery subpack 42. After step 858, the method advances to step 860.

At step 860, the subpack microprocessor 360 of the second battery subpack 42 receives the sixth message requesting the first and second voltage values of the second battery subpack 42 from the master controller 50. After step 860, the method advances to step 862.

At step 862, the subpack microprocessor 360 of the second battery subpack 42 sends the seventh message having the first and second voltage values of the second battery subpack 42 to the master controller 50. After step 862, the method advances to step 864.

At step 864, the subpack microprocessor 360 of the second battery subpack 42 determines whether the subpack microprocessor 360 received a tenth message from the master controller 50 acknowledging receipt of the seventh message within the second predetermined amount of time after sending the seventh message. If the value of step 364 equals "no", the method advances to step 866. Otherwise, the method is exited.

At step 866, the subpack microprocessor 360 of the second battery subpack 42 stops generates the fifth and sixth control signals to induce the first and second subpack contactors 371, 372, respectively, of the second battery subpack 42 to each have an open operational state. After step 866, the method is exited.

It is noted that although the battery system 22 has been utilized in a vehicle herein, in an alternate design the battery system 22 could be utilized in a stationary energy storage system (ESS) that supplies electrical power to any desired electrical load (other than a vehicle powertrain).

While the claimed system has been described in detail in connection with only a limited number of systems, it should be readily understood that the system is not limited to such disclosed system. Rather, the claimed system can be modified to incorporate any number of variations, alterations, substitutions or equivalent arrangements not heretofore described, but which are commensurate with the spirit and scope of the disclosure. Additionally, while various aspects of the claimed system have been described, it is to be understood that aspects of the system may include only some of the described aspects. Accordingly, the claimed system is not to be seen as limited by the foregoing description.

What is claimed is:

1. A battery system, comprising:

a first battery subpack having a subpack microprocessor operably coupled to a first electrical connector;

a first switch circuit being electrically coupled to the first battery subpack, the first switch circuit applying an operational voltage to the subpack microprocessor of the first battery subpack when the first switch circuit receives a first control signal from a master controller;

the subpack microprocessor of the first battery subpack determining voltages at a plurality of ports coupled to the first electrical connector to determine a first address associated with the first battery subpack when receiving the operational voltage;

the first battery subpack having first and second battery cells electrically coupled in series to one another, a cell monitoring circuit, and the subpack microprocessor; the cell monitoring circuit of the first battery subpack being operably coupled to the first and second battery cells thereof, the subpack microprocessor of the first battery subpack operably communicating with the cell monitoring circuit thereof; the cell monitoring circuit of the first battery subpack measuring first and second voltages of the first and second battery cells, respectively, thereof to obtain first and second voltage values, respectively;

the first switch circuit being electrically coupled to the subpack microprocessor of the first battery subpack, the first switch circuit applying the operational voltage to the subpack microprocessor of the first battery subpack when the first switch circuit receives the first control signal from the master controller;

the subpack microprocessor of the first battery subpack sending a first message with the first address to the master controller;

the master controller sending a second message that requests the first and second voltage values from the subpack microprocessor of the first battery subpack;

the subpack microprocessor of the first battery subpack sending a third message having the first and second voltage values of the first battery subpack to the master controller;

the master controller stopping a generation of the first control signal to induce the first switch circuit to remove the operational voltage from the subpack microprocessor of the first battery subpack when the master controller does not receive the third message having the first and second voltage values from the subpack microprocessor of the first battery subpack within a first predetermined amount of time after sending the second message;

the master controller sending a fourth message to a vehicle controller requesting that the vehicle controller reduce an electrical load of a vehicle powertrain when the master controller does not receive the third message having the first and second voltage values of the first battery subpack within a second predetermined amount of time after sending the second message.

2. The battery system of claim 1, wherein:

the subpack microprocessor of the first battery subpack stores the first address in a memory device.

3. The battery system of claim 1, further comprising:

a second battery subpack having a subpack microprocessor operably coupled to a second electrical connector;

a second switch circuit being electrically coupled to the subpack microprocessor of the second battery subpack, the second switch circuit applying an operational voltage to the subpack microprocessor of the second battery subpack when the second switch circuit receives a second control signal from the master controller;

the subpack microprocessor of the second battery subpack determining voltages at a plurality of ports coupled to the second electrical connector to determine a second address associated with the second battery subpack when receiving the operational voltage thereof; and the subpack microprocessor of the second battery subpack sending a fifth message with the second address to the master controller.

4. The battery system of claim 3, wherein:

the subpack microprocessor of the second battery subpack stores the second address in a memory device.

5. The battery system of claim 1, wherein:

the first predetermined amount of time is one second; and the second predetermined amount of time is 500 milliseconds.

6. The battery system of claim 1, wherein:

the first battery subpack has a transceiver that operably communicates with the subpack microprocessor of the first battery subpack;

the master controller having a master microprocessor and a transceiver operably communicating with one another; and the transceiver of the master controller operably communicating with the transceiver of the first battery subpack.

7. The battery system of claim 6, wherein:

the transceiver of the first battery subpack being a CAN transceiver, and the transceiver of the master controller being another CAN transceiver.

8. The battery system of claim 1, wherein:

the first battery subpack having an RF transmitter and an RF receiver; the cell monitoring circuit of the first battery subpack being operably coupled to the RF transmitter, the subpack microprocessor of the first battery subpack being operably coupled to the RF receiver;

the RF transmitter sending the first and second voltage values corresponding to the first and second voltages, respectively, of the first and second battery cells, respectively, to the RF receiver; and the subpack microprocessor receiving the first and second voltage values from the RF receiver.

9. The battery system of claim 1, further comprising:

a second battery subpack having first and second battery cells electrically coupled in series to one another, a cell monitoring circuit, and a subpack microprocessor; the cell monitoring circuit of the second battery subpack being operably coupled to the first and second battery cells, respectively, thereof, the subpack microprocessor of the second battery subpack operably communicating with the cell monitoring circuit thereof; the cell monitoring circuit of the second battery subpack measuring first and second voltages of the first and second battery cells thereof to obtain first and second voltage values, respectively thereof;

a second switch circuit being electrically coupled to the subpack microprocessor of the second battery subpack, the second switch circuit applying an operational voltage to the subpack microprocessor of the second battery subpack when the second switch circuit receives a second control signal from the master controller;

the master controller sending a sixth message that requests the first and second voltage values from the subpack microprocessor of the second battery subpack; and the master controller stopping a generation of the second control signal to induce the second switch circuit to remove the operational voltage from the subpack microprocessor of the second battery subpack when the master controller does not receive a seventh message having the first and second voltage values from the subpack microprocessor of the second battery subpack within a third predetermined amount of time after sending the sixth message.

10. The battery system of claim 1, wherein:

The battery system of the first battery subpack having first and second battery cells electrically coupled in series to one another, a cell monitoring circuit, the subpack microprocessor, and first and second subpack contactors; the cell monitoring circuit of the first battery subpack being operably coupled to the first and second battery cells thereof, the subpack microprocessor of the first battery subpack operably communicating with the cell monitoring circuit thereof, the cell monitoring circuit of the first battery subpack measuring first and second voltages of the first and second battery cells, respectively, thereof to obtain first and second voltage values, respectively;

the subpack microprocessor receiving the second message requesting the first and second voltage values of the first battery subpack from the master controller;

the subpack microprocessor of the first battery subpack inducing the first and second subpack contactors of the first battery subpack to each have an open operational state when the subpack microprocessor of the first battery subpack does not receive the fourth message from the master controller acknowledging receipt of the third message within a predetermined amount of time after sending the second message.

11. The battery system of claim 10, wherein:

the predetermined amount of time is 700 milliseconds.

12. The battery system of claim 10, wherein:

the first battery subpack having an RF transmitter and an RF receiver; the cell monitoring circuit of the first battery subpack being operably coupled to the RF transmitter, the subpack microprocessor of the first battery subpack being operably coupled to the RF receiver;

the RF transmitter sending the first and second voltage values corresponding to the first and second voltages, respectively, of the first and second battery cells, respectively, to the RF receiver; and the subpack microprocessor of the first battery subpack receiving the first and second voltage values from the RF receiver.

13. The battery system of claim 10, wherein:

the first subpack contactor of the first battery subpack being coupled to a positive terminal of the first battery cell of the first battery subpack; and the second subpack contactor of the first battery subpack being coupled to a negative terminal of the second battery cell of the first battery subpack.

14. The battery system of claim 10, further comprising:

a first pack contactor being electrically coupled to the first subpack contactor of the first battery subpack; and a second pack contactor being electrically coupled to the second subpack contactor of the first battery subpack.

15. The battery system of claim 10, wherein:

the first battery subpack having a transceiver that operably communicates with the subpack microprocessor of the first battery subpack;

the master controller having a master microprocessor and a transceiver operably communicating with one another; and the transceiver of the master controller operably communicating with the transceiver of the first battery subpack.

16. The battery system of claim 10, further comprising:

a second battery subpack having first and second battery cells electrically coupled in series to one another, a cell monitoring circuit, a subpack microprocessor, and first and second subpack contactors; the cell monitoring circuit of the second battery subpack being operably coupled to the first and second battery cells thereof, the subpack microprocessor of the second battery subpack operably communicating with the cell monitoring circuit thereof, the cell monitoring circuit of the second battery subpack measuring first and second voltages of the first and second battery cells, respectively, thereof to obtain first and second voltage values, respectively;

the subpack microprocessor of the second battery subpack receiving the sixth message requesting the first and second voltage values of the second battery subpack from the master controller;

the subpack microprocessor of the second battery subpack sending a seventh message having the first and second voltage values of the second battery subpack to the master controller; and the subpack microprocessor of the second battery subpack inducing the first and second subpack contactors of the second battery subpack to each have an open operational state when the subpack microprocessor of the second battery subpack does not receive an eighth message from the master controller acknowledging receipt of the seventh message with the predetermined amount of time after sending the sixth message.

17. The battery system of claim 15, wherein:

the first subpack contactor of the second battery subpack being coupled to a positive terminal of the first battery cell of the second battery subpack; and the second subpack contactor of the second battery subpack being coupled to a negative terminal of the second battery cell of the second battery subpack.

18. The battery system of claim 15, further comprising:

a first pack contactor being electrically coupled to the first subpack contactor of the second battery subpack; and a second pack contactor being electrically coupled to the second subpack contactor of the second battery subpack.

* * * * *